(12) United States Patent
Bauch et al.

(10) Patent No.: US 7,465,522 B2
(45) Date of Patent: Dec. 16, 2008

(54) PHOTOLITHOGRAPHIC MASK HAVING HALF TONE MAIN FEATURES AND PERPENDICULAR HALF TONE ASSIST FEATURES

(75) Inventors: Lothar Bauch, Dresden (DE); Gerhard Kunkel, Radebeul (DE); Hermann Sachse, Dresden (DE); Helmut Wurzer, Dresden (DE)

(73) Assignee: Infineon Technologies AG, Munich (DE)

( * ) Notice: Subject to any disclaimer, the term of this patent is extended or adjusted under 35 U.S.C. 154(b) by 685 days.

(21) Appl. No.: 10/487,911

(22) PCT Filed: Jul. 30, 2002

(86) PCT No.: PCT/EP02/08482

§ 371 (c)(1),
(2), (4) Date: Aug. 13, 2004

(87) PCT Pub. No.: WO03/021353

PCT Pub. Date: Mar. 13, 2003

(65) Prior Publication Data

US 2004/0256356 A1 Dec. 23, 2004

(30) Foreign Application Priority Data

Aug. 31, 2001 (DE) ............................ 101 42 588

(51) Int. Cl.
*G03F 1/08* (2006.01)
*G03F 1/14* (2006.01)

(52) U.S. Cl. .......................................... 430/5
(58) Field of Classification Search ............... 430/5
See application file for complete search history.

(56) References Cited

U.S. PATENT DOCUMENTS

| 5,229,230 A | | 7/1993 | Kamon |
| 5,242,770 A | | 9/1993 | Chen et al. |
| 5,585,210 A | * | 12/1996 | Lee et al. ..................... 430/5 |
| 5,667,918 A | | 9/1997 | Brainerd et al. |
| 5,821,014 A | | 10/1998 | Chen et al. |
| 5,900,349 A | | 5/1999 | Han |
| 6,114,071 A | | 9/2000 | Chen et al. |
| 6,114,074 A | * | 9/2000 | Carpi et al. ..................... 430/5 |

(Continued)

FOREIGN PATENT DOCUMENTS

DE 10021096 A1 10/2001

(Continued)

*Primary Examiner*—Mark F Huff
*Assistant Examiner*—John Ruggles
(74) *Attorney, Agent, or Firm*—Dicke, Billig & Czaja, PLLC (57) ABSTRACT

A photolithographic mask having half tone main features and perpendicular half tone assist features. One embodiment provides for the exposure of radiation-sensitive resist layers on semiconductor substrates. The mask has at least one radiation-transmissive substrate and at least one half-tone layer. The half-tone layer is used to provide main features, the main features being formed in such a way that the pattern formed by the main features is transferred into the resist layer when irradiated, and the half-tone layer is also used to provide assist features, the assist features being formed substantially perpendicular to the main features in such a way that the pattern formed by the assist features is not transferred into the resist layer when irradiated.

18 Claims, 5 Drawing Sheets

U.S. PATENT DOCUMENTS

| | | | |
|---|---|---|---|
| 6,838,216 B2 * | 1/2005 | Griesinger et al. | 430/5 |
| 6,849,364 B2 * | 2/2005 | Kieslich et al. | 430/5 |
| 7,074,525 B2 * | 7/2006 | Wu et al. | 430/5 |
| 7,141,338 B2 * | 11/2006 | Chen et al. | 430/5 |
| 2002/0006554 A1 * | 1/2002 | Fischer et al. | 430/5 |
| 2002/0015900 A1 * | 2/2002 | Petersen | 430/5 |
| 2005/0153216 A1 * | 7/2005 | Crell et al. | 430/5 |
| 2006/0177744 A1 * | 8/2006 | Bodendorf et al. | 430/5 |

FOREIGN PATENT DOCUMENTS

| | | |
|---|---|---|
| DE | 10038928 A1 | 2/2002 |
| EP | 0 770 926 A2 | 5/1997 |
| EP | 0 770 926 A3 | 12/1997 |
| EP | 1 241 525 A2 | 9/2002 |

* cited by examiner

FIG 4

Prior Art

FIG 5

Prior Art

FIG 6

Prior Art

FIG 7

Prior Art

PHOTOLITHOGRAPHIC MASK HAVING HALF TONE MAIN FEATURES AND PERPENDICULAR HALF TONE ASSIST FEATURES

CROSS REFERENCE TO RELATED APPLICATION

This Utility Patent Application claims the benefit of the filing date of German Application No. 101 42 588.0, filed Aug. 31, 2001, and International Application No. PCT/EP2002/08482, filed Jul. 30, 2002, both of which are herein incorporated by reference.

BACKGROUND

The present invention relates to photolithographic masks. The present invention relates to photolithographic masks for the patterning of radiation-sensitive resist layers on semiconductor substrates for the fabrication of large scale integrated semiconductor components.

In the course of the ever decreasing structure dimensions for the production of large scale integrated semiconductor components, a dimensionally accurate photolithographic transfer of mask structures to radiation-sensitive resist layers becomes more and more important. Semiconductor components are fabricated with structure line widths of 180 nm or less for commercial use in large volumes, so that the requirements made of the patterning processes must satisfy very high standards. The photolithographic transfer of mask structures to radiation-sensitive resist layers is one of the outstanding techniques for patterning layers on semiconductor components.

The photolithographic transfer or mask structures to a radiation-sensitive resist layer is effected in a plurality of processes. The alignment of the mask above the substrate covered with the radiation-sensitive resist layer is followed by the exposure of the radiation-sensitive resist layer through the mask for marking the resist layer material to be removed (or to be left). The exposure of the radiation-sensitive resist layer can be effected in the silhouette method, the mask bearing on the resist layer (contact exposure) or being applied closely above the resist layer (proximity exposure). For very high resolution patterning, on the other hand, the exposure is carried out by using a projection exposure. The light that has passed through the mask is focused in a projection objective onto the resist layer, the projection objective imaging the maximum possible number of higher orders of diffraction produced by the mask structure. This imaging method makes it possible to image a minimum transferable structure line width $b_{min}$ of $$b_{min} = k_1(\lambda/NA) \quad (1)$$

from the mask onto the resist layer. $\lambda$ is the wavelength with which exposure is effected, and NA is the numerical aperture, i.e. essentially the ratio of half the lens window diameter to the distance between wafer and lens; in the region of the resolution limit, the proportionality constant $k_1$ adopts values $k_1 < 0.5$, and special measures have to be taken to increase the contrast, in order to ensure a sufficient process window for the lithography.

If the radiation-sensitive resist layer is a positive resist layer, then the exposure brings about at the exposed locations a chemical alteration of the resist layer material, which can be flushed out from the resist layer during development. By contrast, if the radiation-sensitive resist layer is a negative resist layer, then the non-exposed material is flushed out during development. In order to obtain the same structure as in the case of the positive resist, the mask must be patterned essentially complementarily with respect to the mask for the positive resist.

The exposure and further processes, such as the initiation of the "PAG" (photo acid generator), the "PEB" (post exposure bake) and the adjustment of the diffusion gradient and therefore of the resist profile, is followed by the development of the resist layer by spraying or dripping on developer liquid which selectively strips away (or selectively leaves resistant) the marked resist layer material. After the drying of the substrate, the patterned resist is finally obtained, which, in conclusion, is generally subjected to a thermal process for curing.

The minimum structure line width on the mask which is actually produced after the production of the resist structure is greater than that calculated from (1), for a number of reasons. The resist layer has a finite thickness, so that the imaging blurs slightly; furthermore, the developer acts isotropically, so that the resist is also removed in the lateral direction during the development of the resist layer. The minimum structure line width on the mask which is required for the production of a resist layer structure on a semiconductor substrate therefore depends on many parameters and is determined individually for each patterning process.

The mask includes e.g., an unpatterned quartz glass substrate which is light-transmissive even in the UV region and on which a thin opaque layer, usually made of black chromium, is applied. The black chromium layer produces, together with the transmissive regions, the mask structure which is imaged onto the resist layer. The black chromium layer produces the darkened regions on the resist layer, while the light-transmissive region produces the exposed regions on the resist. If the resist is positive, the rate at which the resist is removed in the developer is drastically increased in the exposed regions compared to the unexposed regions and the development process leads to the removal of material. If the resist is negative, the resist crosslinks in the exposed regions, so that predominantly the unexposed regions are removed during the development. Furthermore, for dimensionally accurate feature transfer, it is important to ensure a homogeneous exposure dose over the region to be exposed.

Various effects can contribute to impairing the dimensional fidelity. The finite resist contrast $\gamma$, which is a measure of the resist removal gradient for a given exposure dose, causes rounding of originally cornered mask structures. Furthermore, interference effects, diffraction effects and scattered light which arise at structure elements of the mask, the resist layer and/or the prepatterned substrate surface can result in the effective exposure dose not being homogeneous in the resist layer regions.

The defraction and interference effects of mask features which lie close together, known as proximity effects, can significantly impair the dimensional accuracy which can be achieved. The closer together the features lie, the more pronounced the proximity effects become. The result of this, for example, is that features which should actually be of the same size are reproduced differently in the resist layer according to what surrounds them. This difference is particularly evident between features which are arranged very close together and features which are substantially isolated without adjacent features.

To substantially compensate for this difference, it is customary to use assist features, known as scattering bars or SRAFs=sub resolution assist features, which are arranged in the vicinity of isolated features. Accordingly, a structure which is actually isolated now has a surrounding area which substantially corresponds to the area surrounding tightly packed features, so that substantially the same reproduction properties result. These assist features are formed on the mask in such a way that they are not themselves reproduced in the resist layer and they are in each case arranged in parallel to the edges of the actual features on the mask. Assist features of this type are described, for example, in U.S. Pat. Nos. 5,242,770 and 5,821,014.

The conventional assist features are particularly suitable for improving the reproduction properties of isolated features. However, it is quite possible that in the layout of a mask there may be features which are neither clearly isolated nor arranged particularly close together. For example, it is not always possible to make the distance between two gate paths so great that their associated assist features in each case fit between the gate tracks, or for the gate tracks to be laid so close together that they have sufficiently good reproduction properties even without assist features. For these cases, a single assist feature is generally placed in the center between the two gate tracks. However, this assist feature is generally not at the optimum distance from the gate tracks, and for many distance ranges it has scarcely any further enlarging effect on the focus process window in lithography. However, if these distance ranges are prohibited in design, this has adverse effects on design outlay and the chip size.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Therefore, one or more embodiments of the present invention provide a photolithographic mask which reduces or completely avoids the problems described.

According to the invention, a photolithographic mask for the exposure of radiation-sensitive resist layers on semiconductor substrates is provided, the mask having at least one radiation-transmissive substrate and at least one radiation-opaque layer and/or at least one half-tone layer. The radiation-opaque layer and/or the half-tone layer are used to provide main features, the main features being formed in such a way that the pattern formed by the main features is transferred into the resist layer when irradiated, and the radiation-opaque layer and/or the half-tone layer are used to provide assist features, the assist features being formed in such a way that the pattern formed by the assist features is not transferred into the resist layer when irradiated.

In this context, a half-tone layer is understood as meaning a layer which transmits a certain percentage of the radiation and which shifts the phase of the radiation passing through it by a predetermined amount. Depending on the particular application, the main or assist features may be formed from subregions of the radiation-opaque layer or of the half-tone layer or as openings in the radiation-opaque layer or the half-tone layer.

The photolithographic mask is characterized in that for one main feature, which is oriented in a first direction at least in the region of a partial piece, there are at least two assist features (15), which, adjacent to the partial piece, are oriented in a second direction which is substantially perpendicular to the first direction.

According to one embodiment of the photomask, between two directly adjacent main features, which at least in the region of a partial piece are oriented substantially parallel in a first direction, there are at least two assist features, which are oriented in a second direction substantially perpendicular to the first direction.

The main features or the partial pieces of which the main features are often composed are generally of a shape which has a considerably greater extent along one direction (longitudinal direction) than in a direction perpendicular thereto. The main features or their partial pieces typically have a shape which is similar to a rectangle and is considerably longer than it is wide. Accordingly, it could be the that the main features or the partial pieces of the main features are oriented in one direction, namely their longitudinal direction. The assist features are generally also of a shape which has a considerably greater extent along one direction (longitudinal direction) than in a direction perpendicular thereto. Accordingly, the assist features are also oriented in one direction, namely their longitudinal direction.

The prior art in each case uses assist features which are oriented substantially parallel to the main features or to partial pieces of the main features. However, as has already been explained, this leads to difficulties in particular in situations in which the main features are at a distance from one another which is neither particularly great (isolated main features) nor particularly small (densely packed main features).

By contrast, the photolithographic mask uses assist features which are oriented substantially perpendicular to the main features. The photolithographic mask has the advantage that now even main features or edges of main features whose reproduction properties it was hitherto impossible to improve by using assist features experience an improvement in their reproduction properties, with the result that in particular the process window for the entire lithography process is improved.

According to one embodiment of the photolithographic mask, the assist features are rectangular in shape. Furthermore, it is preferable if the width b of the assist features lies in the range $\lambda/(10\ NA) < b < \lambda/(3\ NA)$, where $\lambda$ is the wavelength of the radiation used to irradiate the mask or the resist layer.

According to one embodiment of the photolithographic mask, the distance D between the main features lies in the range $\lambda/(2\ NA) < D < 3\lambda/NA$. Furthermore, it is preferable if the distance x between the assist feature ends and the main features lies in the range $\lambda/(5\ NA) < x < 2\lambda/(3\ NA)$ and if the distance d between the assist feature ends lies in the range $\lambda/(3\ NA) < d < 3\lambda/(2\ NA)$.

According to one embodiment of the photolithographic mask, for one main feature, which is oriented in a first direction at least in the region of a partial piece, there are at least four, preferably at least six assist features, which, adjacent to the partial piece, are oriented in a second direction substantially perpendicular to the first direction.

According to one embodiment of the photolithographic mask, the ratio of length to width of the main features is greater than 2, preferably greater than 3.

Figure 1:
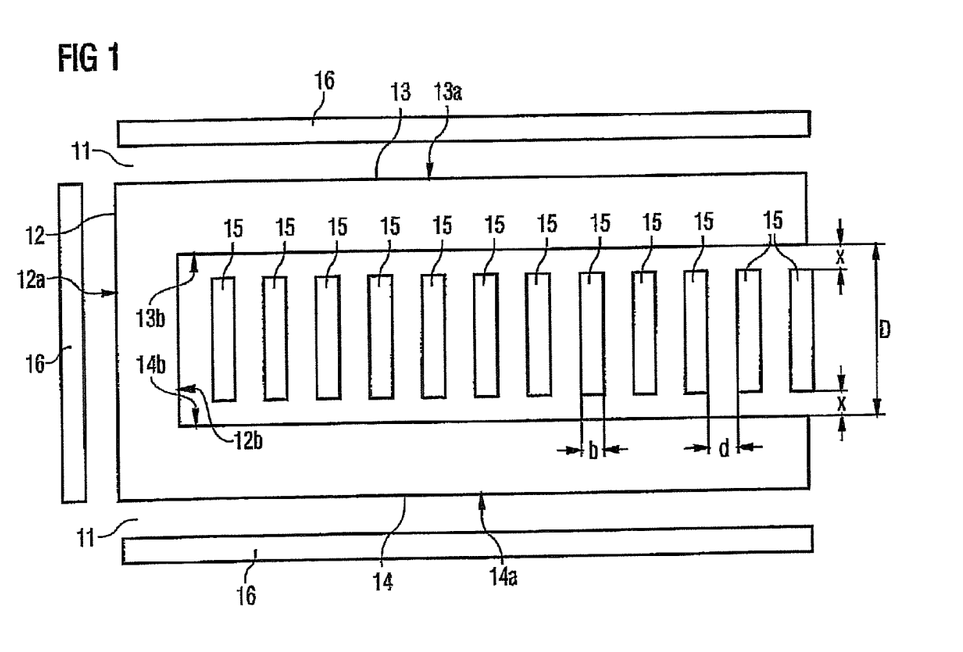
FIG. 1 illustrates a photolithographic mask in accordance with one embodiment.

FIG. 1 illustrates a plan view of a photolithographic mask in accordance with a first embodiment of the present invention. The embodiment illustrated in FIG. 1 has a radiation-transmissive substrate (11), for example including quartz glass, and radiation-opaque features (12, 13, 14, 15 and 16) which are applied to the substrate. By way of example, black chromium can be used as material for the radiation-opaque layer.

The mask has a group of 3 main features 12, 13 and 14, which are neither completely isolated nor arranged very close together. The main features 12, 13 and 14 are in each case provided as opaque regions on the radiation-opaque layer. The main features 12, 13, 14 are formed in such a way that the pattern formed by the main features 12, 13, 14 is transferred into the resist layer (not illustrated) when irradiated. The main features 12, 13, 14 therefore define the pattern which is to be transferred. The main features 12, 13, 14 may be regarded as individual main features or as partial pieces of a "large", U-shaped main feature.

The main features 12, 13, 14 illustrated in FIG. 1 represent substantially isolated main features which, to improve their reproduction properties, are dependent on additional assist features. Therefore, the assist features 16, which are oriented parallel to the main features 12, 13, 14 as in the prior art, are arranged adjacent to the outer edges 12a, 13a, 14a. The assist features 16 are rectangular in shape and are formed in such a manner that the pattern formed by the assist features 16 is not transferred into the resist layer when irradiated.

The assist features 16 improve in particular the reproduction properties of the outer edges 12a, 13a, 14a of the main features 12, 13, 14. To improve the reproduction properties of the inner edges 12b, 13b, 14b of the main features 12, 13, 14, assist features are once again required. However, the main features 12, 13, 14 are arranged in such a way with respect to one another that conventional assist features, arranged parallel to the main features 12, 13, 14, cannot be used, since these conventional assist features would interfere with one another. Particularly if the distance D between the two main features lies in the range $\lambda/(2\ NA) < D < 3\lambda/NA$, it is impossible to use parallel assist features corresponding to the assist features 16.

In order, despite these difficulties, to ensure that the reproduction properties of the inner edges 12b, 13b, 14b of the main features 12, 13, 14 are improved, the photolithographic mask uses assist features 15 which are oriented substantially perpendicular to the main features 13, 14. The assist features 15 are likewise of rectangular design and are arranged symmetrically with respect to the main features 13, 14, between the main features 13, 14.

The distance x between the assist features 15 and the main features lies in the range $\lambda/(5\ NA) < x < 2\lambda/(3\ NA)$, and the distance d between the assist features lies in the range $\lambda/(3\ NA) < d < 3\lambda/(2\ NA)$. Furthermore, the width b of the assist features 15 lies in the range $\lambda/(10\ NA) < b < \lambda/(3\ NA)$, where $\lambda$ is the wavelength of the radiation used to irradiate the mask or the resist layer. The precise lengths, distances and widths of the assist features 15 are dependent on a multiplicity of process parameters, such as for example the photoresist used, the irradiation dose, etc., and consequently these variables have to be adjusted to match the particular lithography process.

The photolithographic mask has the advantage that the reproduction properties of even the edges 13b and 14b of the main features 13 and 14 whose reproduction properties it was hitherto impossible to improve by assist features are improved, with the result that in particular the process window for the entire lithography process is improved.

The embodiment described with reference to FIG. 1 relates to a photomask which has a radiation-opaque layer, for example a black chromium layer. The text which follows describes one embodiment which, instead of a radiation-opaque layer, has a half-tone layer, for example an $MoSi_zO_xN_y$ layer.

For this purpose, instead of a radiation-opaque layer, a half-tone layer is applied to the glass substrate, the half-tone layer being radiation-transmissive to a certain percentage (e.g., 3% to 10% radiation transmission) and shifting the phase of the radiation passing through the half-tone layer by a predetermined amount. Then, this half-tone layer is patterned accordingly, so that features which are matched to the pattern which is to be transferred are produced in the layer. If the mask is then irradiated, a phase shift (generally 180°) takes place at the edges of the features, with the result that it is possible to increase the resolution which can be achieved.

Figure 2:
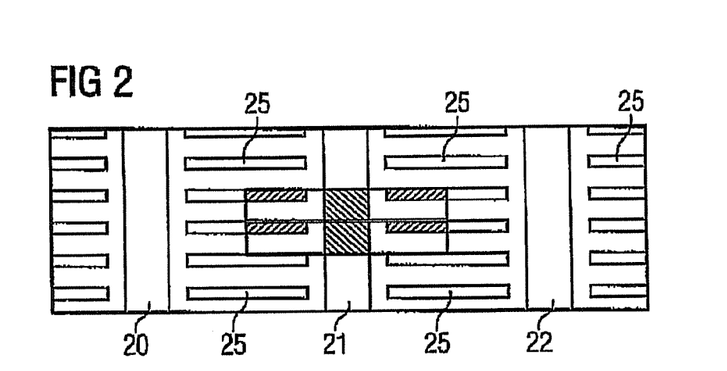
FIG. 2 illustrates a photolithographic mask in accordance with one embodiment.

FIG. 2 illustrates a plan view of part of a photomask, in which the main features 20, 21 and 22 are formed from half-tone material. The thickness of the half-tone material is selected in such a way that a phase shift of 180° with respect to the surrounding area takes place at the edges of the main features 20, 21 and 22 when the radiation passes through it. The main features 20, 21 and 22 are formed in such a way that the pattern formed by the main features 20, 21 and 22 is transferred into the resist layer (not illustrated) when irradiated. The main features 20, 21 and 22 therefore define the pattern which is to be transferred.

The main features 20, 21 and 22 illustrated in FIG. 2 in turn represent substantially isolated main features, which are reliant on additional assist features in order for their reproduction properties to be improved. Accordingly, the photolithographic mask uses assist features 25 including half-tone material which are oriented substantially perpendicular to the main features 20, 21 and 22. The thickness of the half-tone material is once again selected in such a way that, at the edges of the auxiliary features 25, when the radiation passes through it, there is in each case a phase shift of 180° with respect to the surrounding area. The assist features 25 are likewise rectangular in form and are arranged symmetrically with respect to the main features 20, 21 and 22, between the main features 20, 21 and 22. Once again, the assist features 25 are formed in such a way that the pattern formed by the assist features is not transferred into the resist layer when irradiated.

In the present example, the main features 20, 21 and 22 have a width of 200 nm, which, when irradiated, leads to a feature with a width of 190 nm in the resist layer. The distance between the main features is 1000 nm. The assist features 25 have a width of 50 nm and are arranged at a distance of 125 nm. This illustrates that, unlike with conventional photomasks, in a photomask the "mask bias", i.e. the widening of the feature on the mask compared to the width of the feature in the resist layer, can be considerably reduced.

Figure 3:
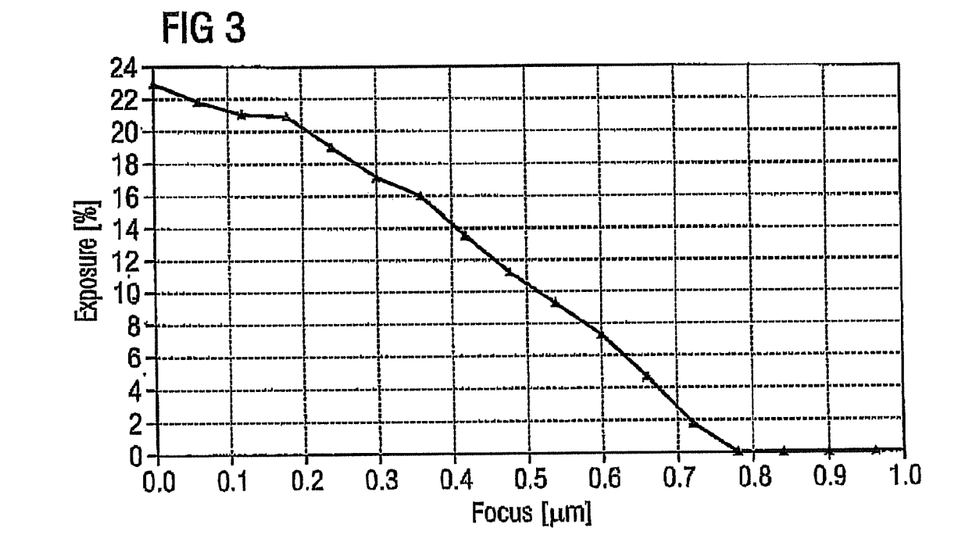
FIG. 3 illustrates a diagram which illustrates the way in which the irradiation intensity is dependent on the defocusing of the irradiation for the photomask illustrated in FIG. 2.

FIG. 3 illustrates a diagram which represents the way in which the irradiation intensity is dependent on the defocusing of the irradiation. The area below the curve represents the combinations of parameters with which good reproduction of the main features can be achieved. The area below the curve is therefore a measure of the process window within which the irradiation parameters may be varied. It can be seen that the defocusing of the irradiation can be varied over a wide range, yet it is nevertheless possible to ensure good reproduction of the main features.

Figure 4:
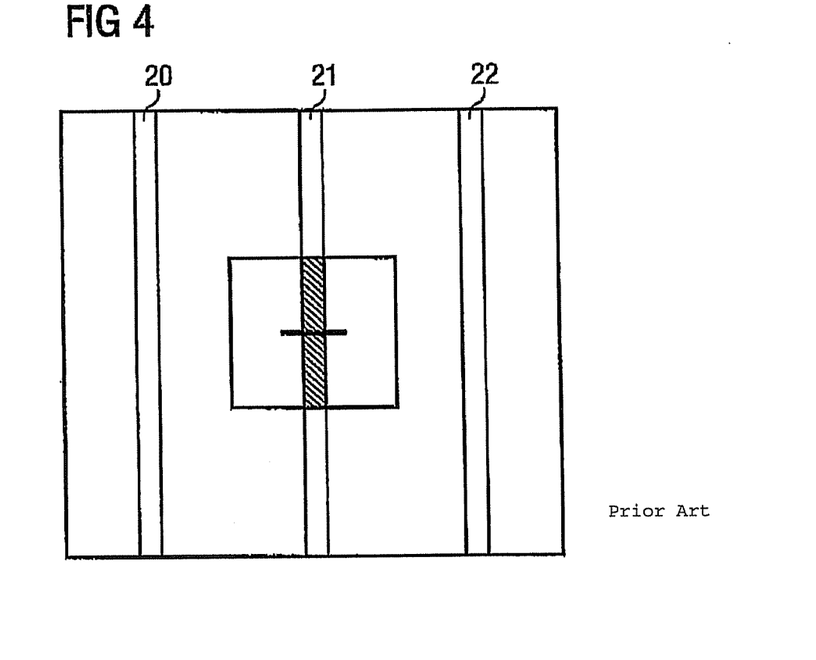
FIG. 4 illustrates a photolithographic mask in accordance with the prior art.
Figure 5:
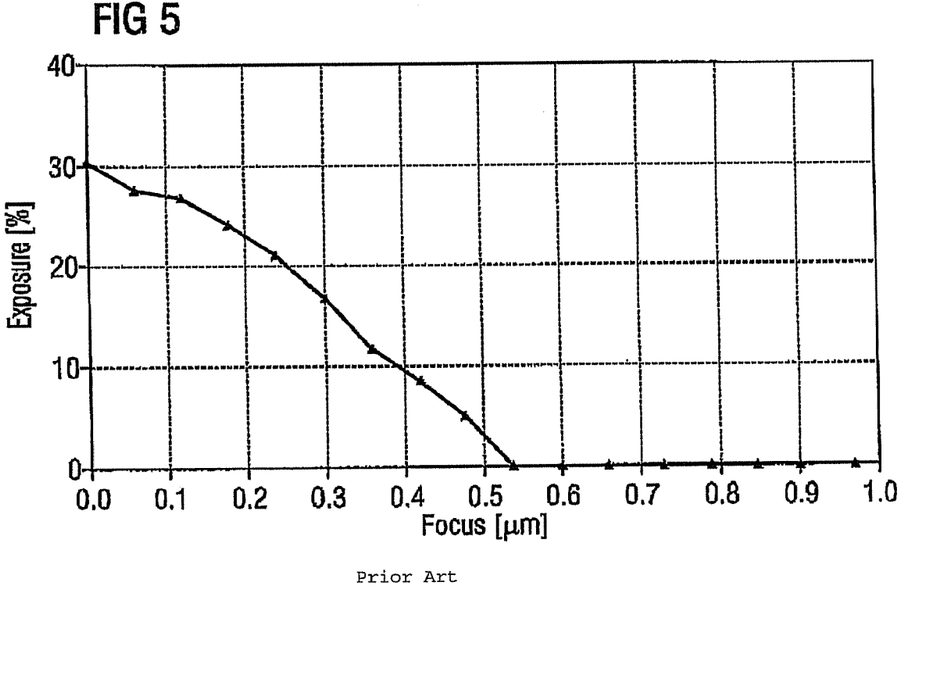
FIG. 5 illustrates a diagram which illustrates the way in which the irradiation intensity is dependent on the defocusing of the radiation for the photomask illustrated in FIG. 4.

For comparison purposes, FIG. 4 illustrates a photomask in accordance with the prior art, which has only the main features 20, 21 and 22 but no assist features. In this case, the width of the main features 20, 21 and 22 is 250 nm, in order to generate tracks with a width of 190 nm in the resist layer. Accordingly, the conventional photomask requires a considerably greater mask bias than the photomask. As can be seen from FIG. 5, the size of the process window is also considerably reduced for the conventional photomask, which in practice means that the main features 20, 21 and 22 cannot be reproducibly transferred into a resist layer.

Figure 6:
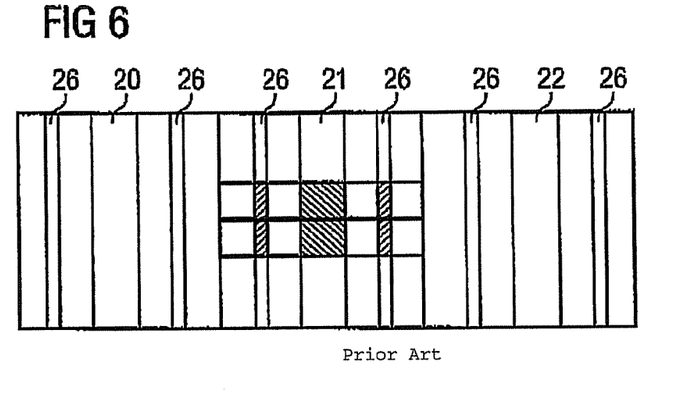
FIG. 6 illustrates a further photolithographic mask in accordance with the prior art.

Once again for comparison purposes, FIG. 6 illustrates a photomask in accordance with the prior art which has the main features 20, 21 and 22 and conventional, parallel assist features 26. In this case, the width of the main features 20, 21 and 22 is 240 nm, in order to generate tracks with a width of 190 nm in the resist layer. Accordingly, this conventional photomask once again requires a considerably greater mask bias than the photomask.

Figure 7:
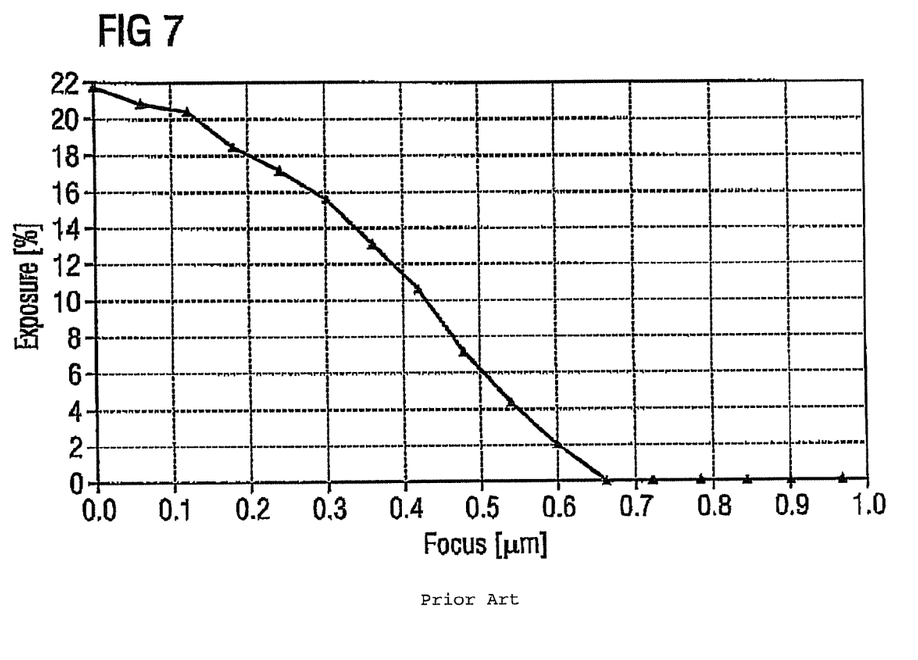
FIG. 7 illustrates a diagram which illustrates the way in which the radiation intensity is dependent on the defocusing of the irradiation for the photomask illustrated in FIG. 6.

Although in this example the main features are at a distance (1000 nm) at which conventional parallel assist features can be used, even for this photomask the process window is considerably reduced in size, as can be seen from FIG. 7.

Figure 8:
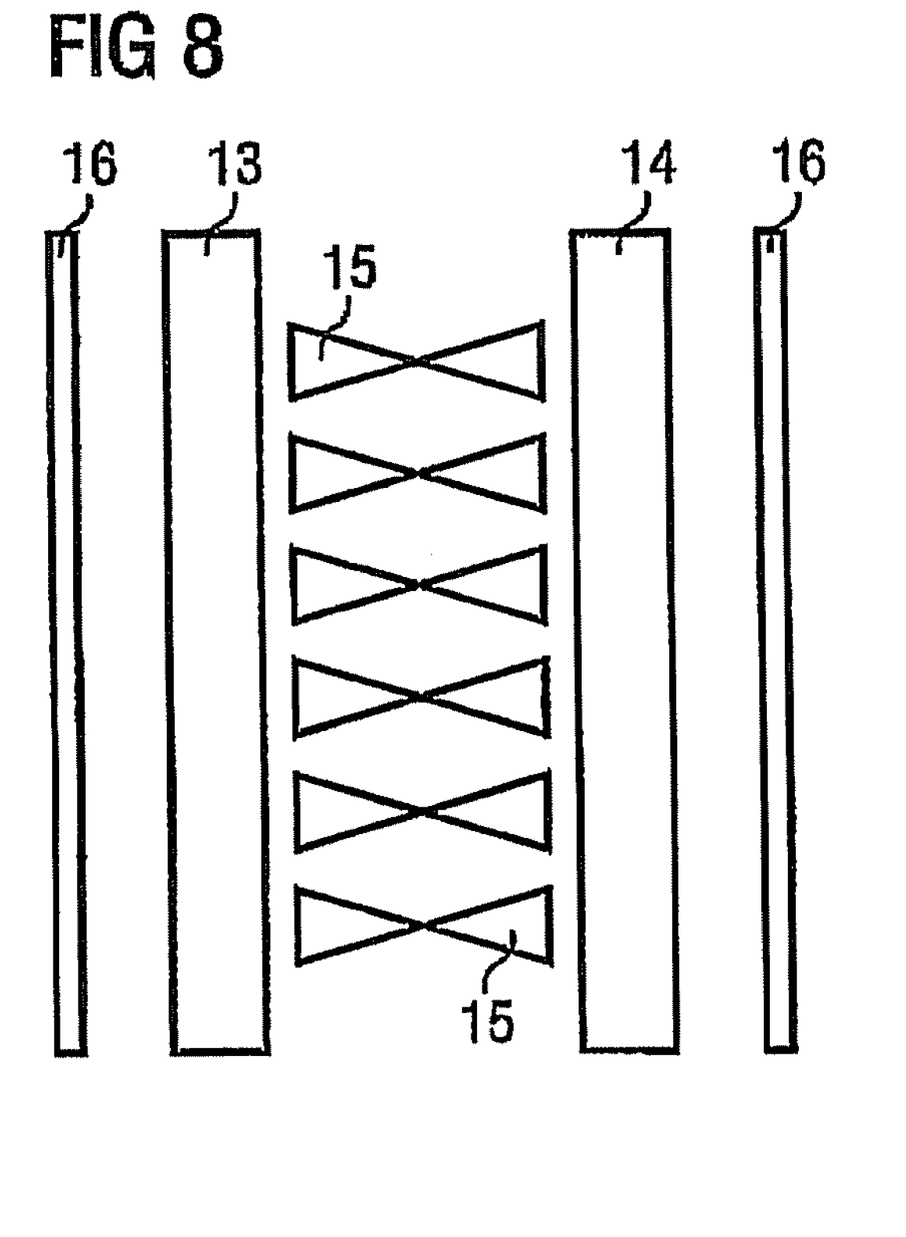
FIG. 8 illustrates a photolithographic mask in accordance with one embodiment.

FIG. 8 illustrates a photolithographic mask according to a further embodiment of the present invention. Unlike the embodiments of the photolithographic mask which have been described hitherto, the assist features 15 are not formed as rectangles, but rather are composed of triangles. The assist features 15 once again have the advantage that the edges 13b and 14b of the main features 13 and 14, whose reproduction properties it was hitherto impossible to improve by using assist features, experience an improvement in their reproduction properties, with the result that in particular the process window for the entire lithography process is improved.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A photolithographic mask for the exposure of a radiation-sensitive resist layer on a semiconductor substrate, the photolithographic mask comprising:

at least one radiation-transmissive substrate, at least one radiation-opaque layer, and at least one half tone layer, the radiation-opaque layer and the at least one half-tone layer being used to provide main features, the main features being formed in such a way that the pattern formed by the main features is transferred into the resist layer when irradiated; and the radiation-opaque layer and the at least one half-tone layer are used to provide assist features, the assist features being formed in such a way that the pattern formed by the assist features is not transferred into the resist layer when irradiated, wherein for one main feature, which is oriented in a first direction at least in the region of a partial piece, there are at least two assist features, which, adjacent to the partial piece, are oriented in a second direction which is substantially perpendicular to the first direction, wherein a distance x of the assist features from the main features lies in the range $\lambda/(5\ NA) < x < 2\lambda/(3\ NA)$.

2. The photolithographic mask of claim 1, wherein between two directly adjacent main features, which at least in the region of a partial piece are oriented substantially parallel in a first direction, there are at least two assist features, which are oriented in a second direction substantially perpendicular to the first direction.

3. The photolithographic mask of claim 1, wherein the assist features are rectangular in shape.

4. The photolithographic mask of claim 1, wherein the assist features are composed of triangular shapes.

5. The photolithographic mask of claim 1, wherein a width b of the assist features lies in the range $\lambda/(10\ NA) < b < \lambda/(3\ NA)$.

6. The photolithographic mask of claim 1, wherein a distance D between the main features lies in the range $\lambda/(2\ NA) < D < 3\lambda/NA$.

7. The photolithographic mask of claim 1, wherein a distance d between the assist features lies in the range $\lambda/(3\ NA) < d < 3\lambda/(2\ NA)$.

8. The photolithographic mask of claim 1, wherein for one main feature, which is oriented in a first direction at least in the region of a partial piece, there are at least four assist features, which, adjacent to the partial piece, are oriented in a second direction substantially perpendicular to the first direction.

9. The photolithographic mask of claim 1, wherein a ratio of length to width of each of the main features is greater than 2.

10. A photolithographic mask for the exposure of a radiation-sensitive resist layer on a semiconductor substrate, the photolithographic mask comprising:

at least one radiation-transmissive substrate and at least one half tone phase shift layer used to transfer main features into the resist layer when irradiated;

the half tone phase shift layer used to provide assist features, such that the pattern formed by the assist features is not transferred into the resist layer when irradiated; and where for one main feature, which is oriented in a first direction at least in the region of a partial piece, there are at least two assist features, which, adjacent to the partial piece, are oriented in a second direction which is substantially perpendicular to the first direction; and wherein a distance x of the assist features from the main features lies in the range $\lambda/(5\ NA) < x < 2\lambda/(3\ NA)$.

11. The photolithographic mask of claim 10, wherein between two directly adjacent main features, which at least in the region of a partial piece are oriented substantially parallel in a first direction, there are at least two assist features, which are oriented in a second direction substantially perpendicular to the first direction.

12. The photolithographic mask of claim 10, wherein the assist features are rectangular in shape.

13. The photolithographic mask of claim 10, wherein the assist features are composed of triangular shapes.

14. The photolithographic mask of claim 10, wherein a width b of the assist features lies in the range $\lambda/(10\ NA) < b < \lambda/(3\ NA)$.

15. The photolithographic mask of claim 10, wherein for one main feature, which is oriented in a first direction at least in the region of a partial piece, there are at least four assist features, which, adjacent to the partial piece, are oriented in a second direction substantially perpendicular to the first direction.

16. The photolithographic mask of claim 10, wherein a distance D between the main features lies in the range $\lambda/(2\ NA) < D < 3\lambda/NA$.

17. The photolithographic mask of claim 16, wherein a distance d between the assist features lies in the range $\lambda/(3\ NA) < d < 3\lambda/(2\ NA)$.

18. The photolithographic mask of claim 17, wherein a ratio of length to width of the main feature is greater than 2.

\* \* \* \* \*